United States Patent [19]

Saitoh

[11] Patent Number: 5,670,809
[45] Date of Patent: Sep. 23, 1997

[54] NON-VOLATILE SEMICONDUCTOR MEMORY DEVICE

[75] Inventor: Kenji Saitoh, Tokyo, Japan

[73] Assignee: NEC Corporation, Tokyo, Japan

[21] Appl. No.: 619,189

[22] Filed: Mar. 21, 1996

[30] Foreign Application Priority Data

Mar. 22, 1995 [JP] Japan ................................. 7-087652

[51] Int. Cl.⁶ .................................................... H01L 29/788
[52] U.S. Cl. ............................ 257/316; 257/314; 257/315
[58] Field of Search .............................. 257/314, 315, 257/316

[56] References Cited

U.S. PATENT DOCUMENTS

| | | | |
|---|---|---|---|
| 5,070,032 | 12/1991 | Yuan et al. | 437/43 |
| 5,237,196 | 8/1993 | Mikata et al. | 257/409 |
| 5,365,098 | 11/1994 | Miyamoto et al. | 257/316 |
| 5,418,741 | 5/1995 | Gill | 365/182 |
| 5,446,298 | 8/1995 | Kojima | 257/314 |

FOREIGN PATENT DOCUMENTS 2-292870  12/1990  Japan .

Primary Examiner—Ngân V. Ngô
Attorney, Agent, or Firm—Foley & Lardner

[57] ABSTRACT

A flash memory has diffused layers extending in a column direction to form channel regions between each two of the diffused layers, field oxide films extending in a row direction to divide the channel regions into separate channels arranged in a matrix, a floating gate disposed for each channel as a split gate, and a strip control gates extending in the row direction and overlying each row of the split floating gate. Each of the floating gates has a lower layer having a lower impurity concentration and an upper layer having a higher impurity concentration. The lower impurity concentration of the lower layer prevents fluctuations in device characteristics while the higher concentration of the upper layer enhances etch rates in two etching process for forming the floating gates of a matrix.

4 Claims, 8 Drawing Sheets

FIG. I
PRIOR ART

NON-VOLATILE SEMICONDUCTOR MEMORY DEVICE

BACKGROUND OF THE INVENTION (a) Field of the Invention

The present invention relates to a non-volatile semiconductor memory device, and in particular, to a non-volatile semiconductor memory device of a type which enables an electrical erasure by a batch process.

(b) Description of the Related Art

Electrically erasable, programmable memory devices, known as EEPROMs, include a flash memory, which is a type of non-volatile memory enabling a batch erasure. Various constructions have been proposed for the flash memory, and include one which is referred to as a virtual ground, split gate type. EEPROM of this type has two features: (1) the source/drain of a memory cell is used as a buried bit line, and (2) selection transistors called "a split gate type" are connected in series in each memory cell. A conventional flash memory of this type is described, for example, in Patent Publication No. JP-A-1990-292870.

Referring to FIGS. 1 to 4, a typical conventional EEPROM of the virtual ground, split gate type will be described. FIG. 1 is a partial plan view of a Cell array of a typical EEPROM of this type, while FIGS. 2 and 3 are sections taken along lines A—A and B—B, respectively, in FIG. 1.

As shown in FIGS. 1 to 3, a plurality of n$^+$-buried diffused layers 8, which constitute source/drain regions, are formed on the surface area of a p-silicon substrate 1, and extend in a column direction, i.e., in the vertical direction as viewed in FIG. 1. The n$^+$-buried diffused layer 8 is covered by a relatively thick silicon oxide film 9. Element separating insulator films or filed oxide films 2 are formed parallel to one other on the substrate 1, extending in a row direction, i.e, in the direction perpendicular to the buried diffused layers 8. A plurality of floating gates 4 made of polycrystalline silicon are formed in a matrix over the substrate 1, with a gate oxide film 3 being interposed therebetween, in a manner such that part of each of the floating gates 4 overlaps the buried diffused layer 8. A strip control gate 6 made of polycrystalline silicon is formed on top of the floating gate 4, with an intergate oxide film 5 being interposed therebetween, and extends in the row direction perpendicular to the buried diffused layer 8. The surface of the control gate 6 is covered by a silicon oxide film 7.

FIG. 4 shows an equivalent circuit diagram of the cell array shown in FIG. 1. As shown in FIG. 4, the n$^+$-buried diffused layers 8 constitute bit lines (B1, B2 . . . ), while the control gates 6 constitute word lines (W1, W2 . . . ). On top of the channel of each memory cell, there are a first portion over which the floating gate 4 and the control gate 6 are disposed in an overlapping relationship and a second portion where the control gate 6 directly opposes the channel, the second portion being a so-called split gate.

The memory operates as follows: A read operation for memory cell (1, 2), for example, i.e., memory cell in first column and second row in FIG. 9, takes place by applying 5 V, for example, to the word line W2, connecting the bit line B1 to the ground, applying 1.5 V to the bit line B2, connecting the remaining word lines W1, W3, W4 . . . to the ground, and leaving the remaining bit lines B3, B4 . . . in a floating state.

A programming operation to memory cell (1, 2) takes place by applying 12 V, for example, to the word line W2, connecting the bit line B1 to the ground, applying 7 V to the bit line B2, and connecting the remaining non-selected word lines W1, W3, W4 . . . to the ground, thus generating in the channel of the selected cell (1, 2) hot electrons which are injected into the floating gate of this cell.

An erase operation of the memory cells takes place by connecting the word line implemented by strip control gate 6 to the ground, and applying 15 V, for example, to the bit lines implemented by n$^+$-buried diffused layers 8, thus extracting carriers from the floating gates to the respective source/drain regions of the memory cells.

The conventional EEPROM as described above are manufactured by steps which are summarized below.

(1) Ions are selectively injected into the surface area of p-silicon substrate i to form n$^+$-buried diffused layer 8.

(2) A silicon oxide film is deposited by a CVD process, and configured in strip patterns extending perpendicular to one another and to the n$^+$-buried diffused layer 8, thus forming the field oxide films 2.

(3) Gate oxide film 3 is formed by thermal oxidation between the field oxide films 2.

(4) In order to form the floating gate 4, a first polycrystalline silicon film doped with phosphorus at a uniform concentration of 1 E 20/cm$^3$ (1×10$^{20}$ atoms/cm$^3$) or greater is deposited, then configured to exhibit strip patterns which extend parallel to one another and to the n$^+$-buried diffused layer 8. The purpose of doping the polycrystalline silicon film with phosphorus, while the film is being formed, is to achieve a film of a uniform concentration over the entire film thickness, and the phosphorus is doped to a high concentration in order to enhance the etch rate and etch selectivity. The structure after the configuring of the first polycrystalline silicon is shown in a perspective view of FIG. 5. The strip polycrystalline silicon films 4a extend parallel to one another in the column direction, which is perpendicular to the field oxide films 2.

5) After formation of the intergate oxide film 5, a second polycrystalline silicon film is deposited and then configured in second strip films which extend parallel to one another and perpendicular to the n$^+$-buried diffused layer 8, thus forming the strip control gates 6 extending in the row direction. Subsequently, the first strip films 4a are patterned by using the strip control gate 6 to define separate floating gates 4 arranged in a matrix.

The conventional EEPROM as described above has a drawback in which erasure current or programming current fluctuates from cell to cell in operation of the flash memory, to thereby reduce the throughput of the flash memory.

SUMMARY OF THE INVENTION

In view of the foregoing, it is an object of the present invention to provide a non-volatile semiconductor memory device which can suppress a fluctuation in the erasing current and the programming current with a minimum rise in costs and reduction in yield thereof.

The present invention is directed to a non-volatile semiconductor memory device comprising a semiconductor substrate, a plurality of diffused layers formed in the semiconductor substrate and extending parallel to one another in a column direction, each adjacent two of the diffused layers defining a channel region, a plurality of field insulating film, extending parallel to one another in a row direction, for dividing each of the channel regions into a plurality of channels, a plurality of floating gates arrayed in matrix in the row and column directions, each of the floating gates being disposed in operative relationship with a corresponding one of the channels, each of the floating gates including a lower layer having a first impurity concentration and an upper layer having a second impurity concentration which is higher than the first impurity concentration, a plurality of control gates extending parallel to one another in the row directions and each overlying a corresponding row of the floating gate.

Also, the present invention provides a method for manufacturing a semiconductor memory device including the steps of forming a plurality of diffused layers in a semiconductor substrate, each adjacent two of the diffused layers forming a channel region, forming a plurality of field insulating films extending parallel to one another in a row direction to divide each of the channel regions into a plurality of channels, forming a first polycrystalline silicon film insulated from the semiconductor substrate and including a lower layer having a first impurity concentration and an upper layer having a second impurity concentration which is higher than the first impurity concentration, patterning the first polycrystalline silicon film into a plurality of first strip films extending parallel to one another in the column direction, forming a second polycrystalline silicon film and patterning the same to form a second strip film overlying the first strip films and extending parallel to one another in the row direction, patterning each of the first strip films into a plurality of floating gates arranged in a matrix, each of the floating gate being disposed in operative relationship with a corresponding one of the channels.

With a non-volatile semiconductor memory device according to the present invention, the floating gate is formed by utilizing a first polycrystalline silicon film having a low impurity concentration in a lower layer thereof adjacent to the gate oxide film while having a high impurity concentration in an upper layer adjacent to the control gate, so that a high etch rate of the first polycrystalline silicon film can be maintained while suppressing an increase in the grain size of the crystalline silicon in its lower layer adjacent to the substrate or gate oxide film. This allows a small reduction in a throughput of the memory while reducing a fluctuation from cell to cell in the erasing current and the programming current, thus stabilizing the erasing and programming response and improving the yield of the non-volatile semiconductor memory.

DESCRIPTION OF PREFERRED EMBODIMENTS

Before describing the present invention, disadvantages of the conventional flash memory are described for the sake of understanding of the present invention.

In the conventional flash memory as described before, the first polycrystalline silicon film which is used to define the floating gate 4 fills a space located between adjacent two of the field oxide films 2, and accordingly, the film thickness at this portion is larger than other portions by an amount substantially corresponding to the thickness of the field oxide films 2. As a consequence, an increased length of time is required to finish the patterning of the polycrystalline silicon film, which takes place twice, at steps for forming strip patterns 4a and for forming separate floating gate 4, as mentioned above. To reduce the time required, it has been a prior art practice to employ an increased impurity concentration for the polycrystalline silicon film which is equal to or higher than 1 E 20/cm$^3$ ($1\times10^{20}$ atoms/cm$^3$).

However, increase of the phosphorus concentration in the floating gate 4 results in an increase of a grain size of the polycrystalline silicon due to the subsequent thermal treatment applied. The increased grain size causes an erasing current to fluctuate in an significant amount from cell to cell, resulting in the likelihood that memory cells are produced which are over-erased during the erase operation of EEPROM flash memory, and thus decreasing the yield thereof.

The reason for the fluctuation of the erasing current to occur is believed to be as follows: In the first polycrystalline silicon, a segregation of phosphorus occurs at the boundary of crystal grains, and such phosphorus permeates into the gate oxide film. A flow of erasing current, i.e., tunnelling current is enhanced in a region where the permeation occurred. Accordingly, as the grain size increases, the permeation of phosphorus occurs in an uneven manner, which gives rise to an uneven flow of erasing current.

For the same reason, as the grain size increases, a fluctuation in the programming current also increases, as does a fluctuation in a threshold voltage after programming has taken place.

In order to reduce the impurity concentration for the floating gate while improving the throughput, it is necessary that patterning of the first polycrystalline film be conducted at a high etch rate. However, a problem arises in that selection ratio will be reduced at the high etch rate, increasing the possibility that the gate oxide film may be etched to damage the substrate surface. The present invention is devised to solve the problems as described above.

Now, embodiments of the invention will now be described with reference to the drawings, in which similar elements are designated by the same, analogous or correlative reference symbols throughout the drawings.

First Embodiment

Figure 1:
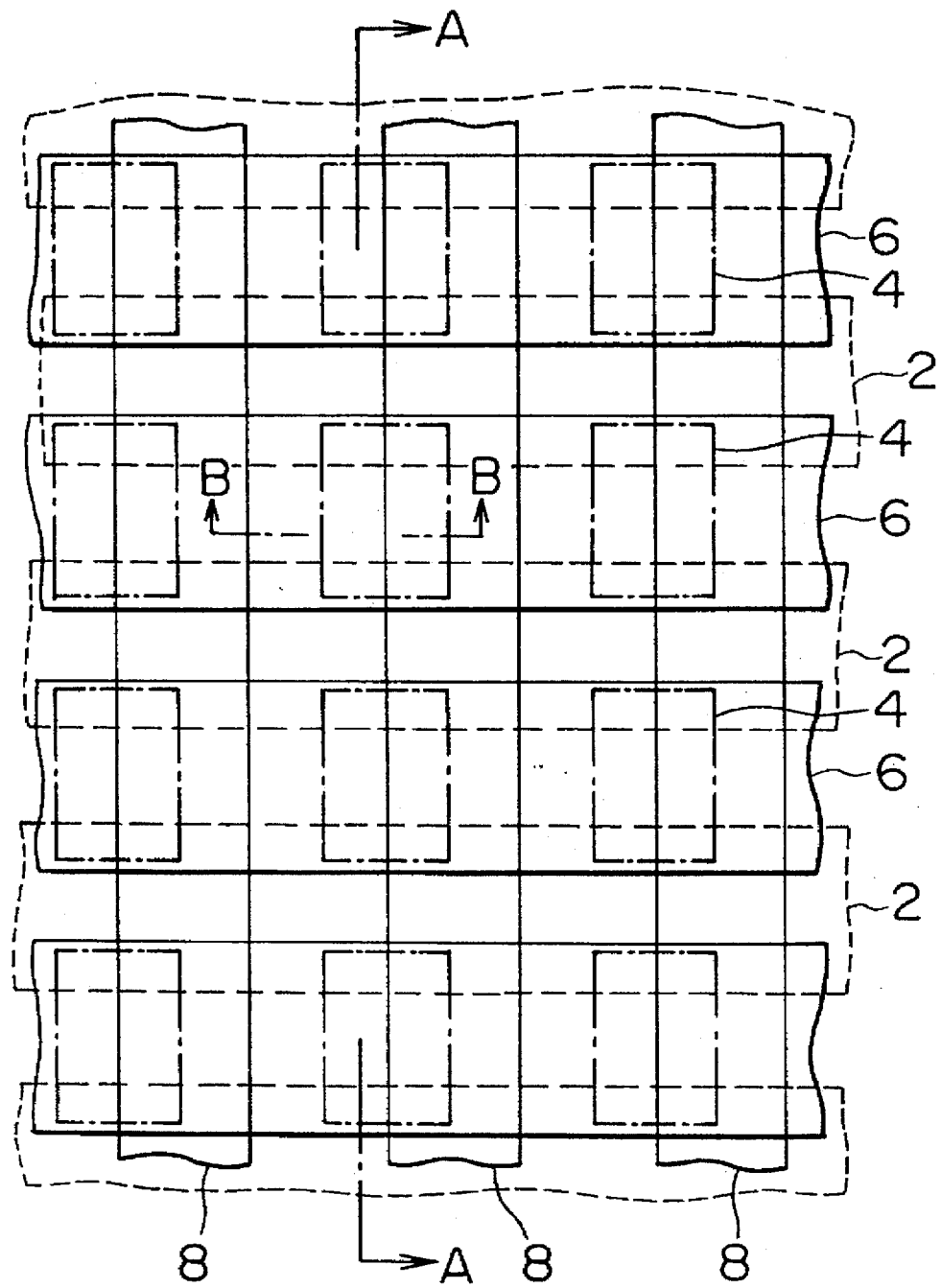
FIG. 1 is a top plan view of a conventional flash memory.
Figure 2:
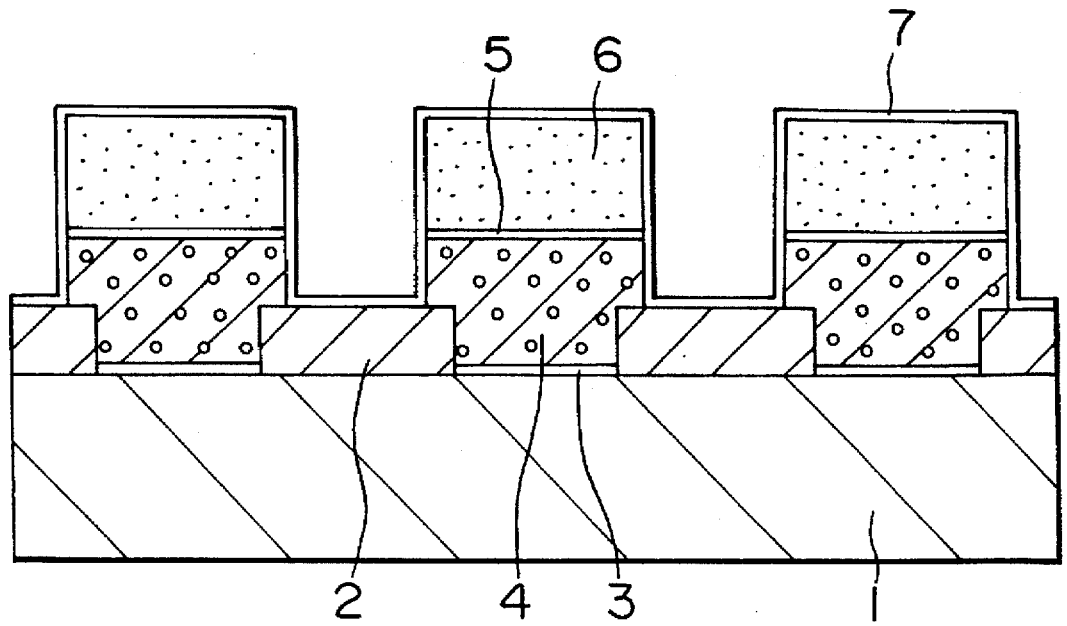
FIG. 2 is a cross section taken along a line A—A shown in FIG. 1.

Referring to FIGS. 6A to 6F, there is shown a flash memory according to a first embodiment of the present invention during consecutive steps of a process for manufacturing the same. The flash memory as finished has a structure and a circuit configuration similar to those shown in FIGS. 1, 3 and 4 except that the floating gates 4 are replaced by floating gates 14 having a two-layer structure in the first embodiment. FIGS. 6A to 8F correspond to the section taken along line A—A in FIG. 1.

Figure 3:
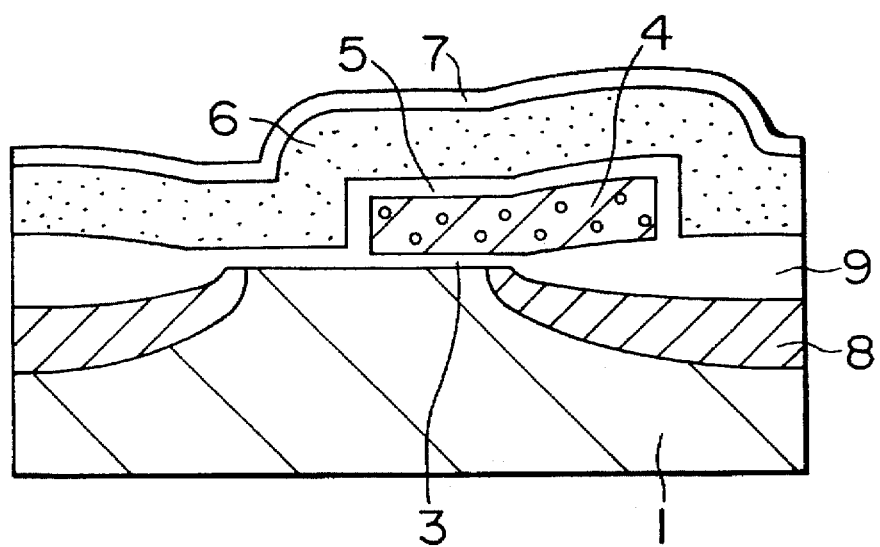
FIG. 3 is a cross section taken along a line B—B shown in FIG. 1.
Figure 4:
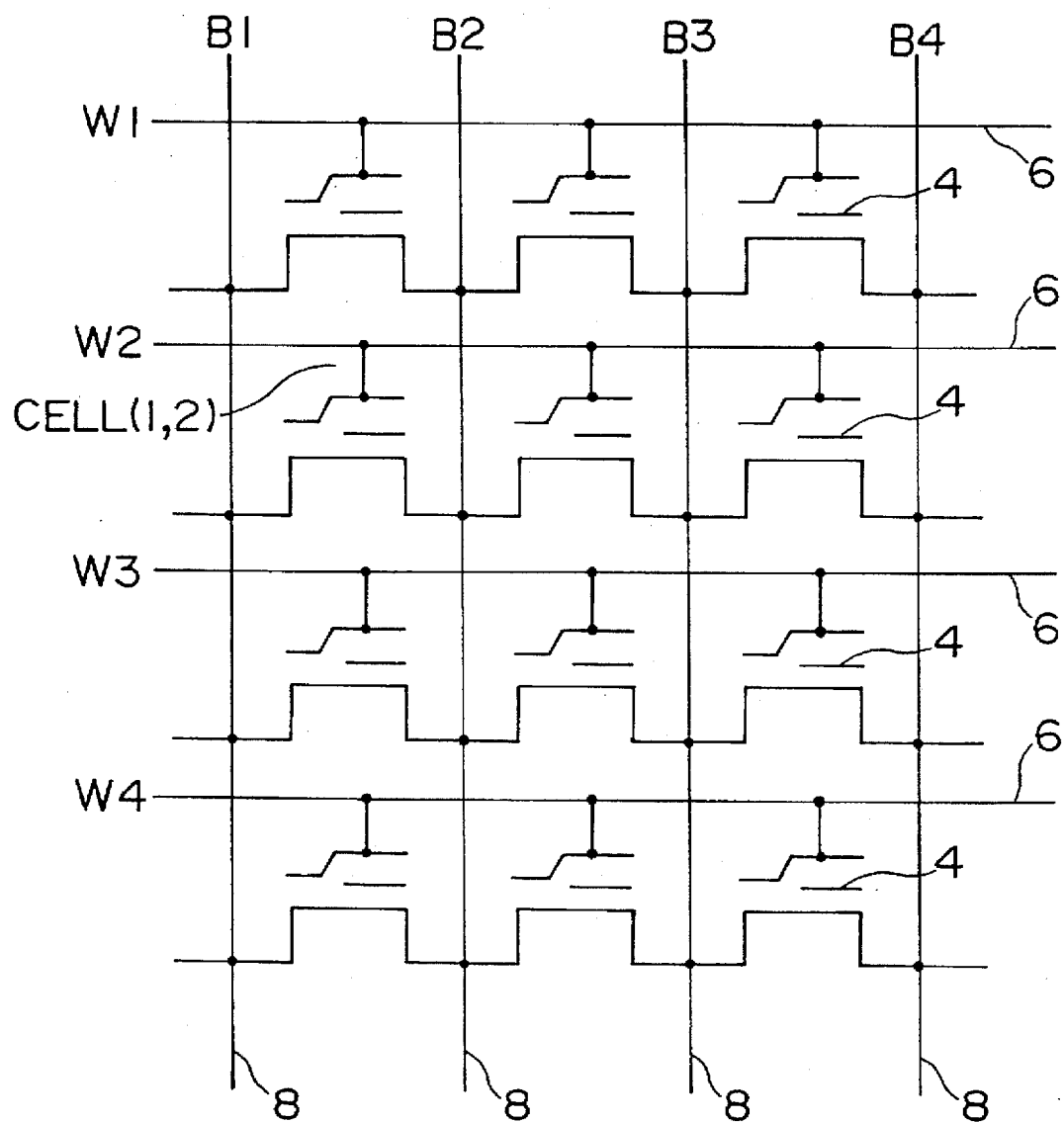
FIG. 4 is an equivalent circuit diagram of FIG. 1.

Initially, a photoresist (not shown) is provided on a p-type silicon substrate 1, and an ion implantation of phosphorus is conducted by a photolithography using the photoresist as a mask. By these steps, n⁺-type buried diffused layers (not shown in these drawings) similar to the n⁺-type buried layers 8 shown in FIG. 3 are formed which extend parallel to one another in a column direction, i.e., in the direction perpendicular to the plane of FIGS. 6A to 6C. Subsequently, a plurality of element separating insulator films or field oxide films 2 having a film thickness on the order of 3,000 angstroms are formed on the p-type silicon substrate 1 by thermal oxidation so as to extend in a row direction, i.e., in the direction perpendicular to the plane of FIGS. 6A to 6C. Then follows forming a gate oxide films 3 having a film thickness on the order of 200 angstroms by using thermal oxidation, thereby obtaining the structure of FIG. 6A.

Figure 6A:
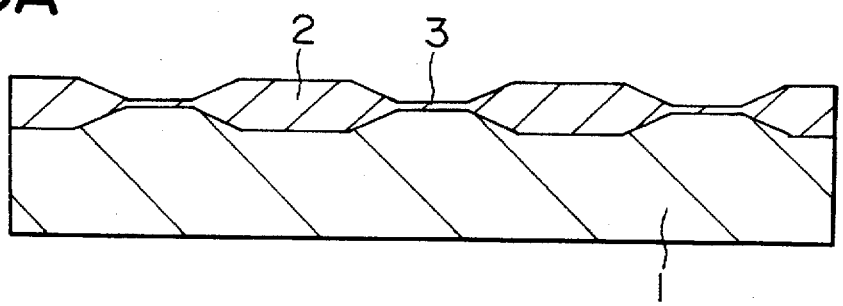
FIGS. 6A to 6F are fragmentary cross sections of a flash memory according to a first embodiment of the present invention, for showing consecutive steps of a manufacturing process.
Figure 6B:
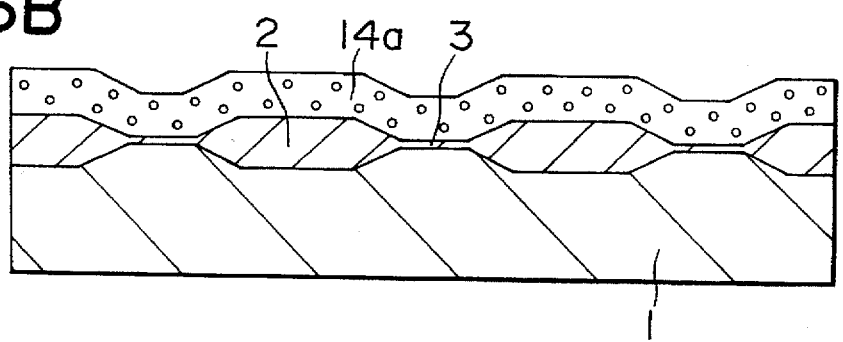

A first polycrystalline silicon film 14a is then grown by a LPCVD (low pressure CVD) process to a film thickness on the order of 3,000 angstroms over the entire surface, as shown in FIG. 6B. It is to be noted that the first polycrystalline silicon film 14a is made of undoped polycrystalline silicon, i.e., silicon not doped with an impurity during the growth. Phosphorus is then introduced into the first polycrystalline silicon film 14a by an ion implantation process. The ion implantation takes place at an energy level which prevents the introduction of the phosphorus at the level deeper than 2,500 angstroms of the entire thickness of 3,000 angstroms of the first polycrystalline silicon film 14a.

Figure 6C:
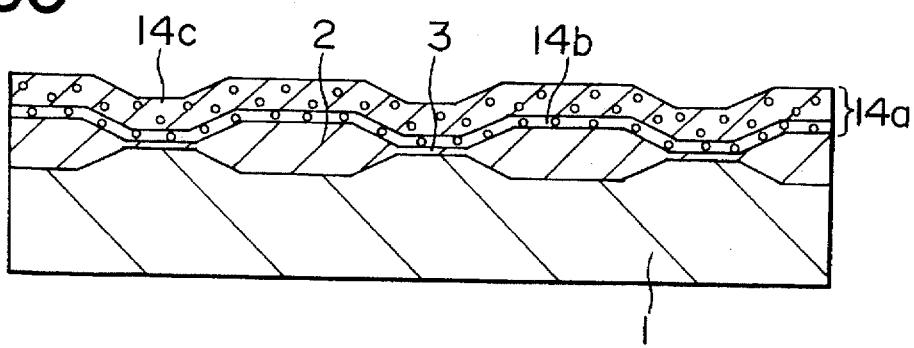

By the ion implantation, the structure of the first polycrystalline film 14a is obtained, as shown in FIG. 6C, having a lower layer 14b of the first polycrystalline silicon film 14a having a lower impurity concentration (substantially undoped lower layer 14b) and an upper layer 14c of the first polycrystalline silicon film 14a having a higher impurity concentration. A reduced phosphorus concentration in the lower layer 14b adjacent to the gate oxide film 3 prevents a grain size in the lower layer 14b from increasing, thus suppressing a fluctuation in the erasing current from cell to cell and hence eliminating the problem of the over-erasure in the conventional flash memory. It is to be noted that when the depth to which the phosphorus is injected is less than half the film thickness of the first polycrystalline film 14a, the throughput during the subsequent etching step will be reduced by an amount corresponding to the thickness of the polycrystalline silicon film which is left undoped or doped at a lower concentration. Accordingly, it is advantageous to obtain a high throughput by reducing the film thickness of the lower layer 14b of the first polycrystalline silicon film 14a having a low concentration, as much as possible, yet consistent with the goal of preventing a fluctuation in the erasing current from cell to cell. In this respect, the lower layer should have a thickness equal to or lower than about half the overall thickness of the first polycrystalline silicon film 14a.

Figure 6D:
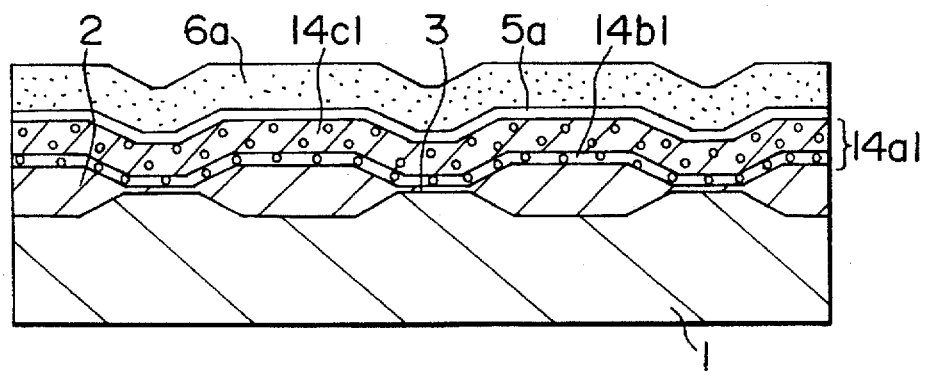

After the ion implantation into the first polycrystalline silicon film 14a to increase its conductivity, the first polycrystalline silicon film 14a is configured in a pattern in which the first polycrystalline film is divided by planes extending parallel to the plane of the drawing in a plurality of first strip film 14a1 each including a lower layer 14b1 and an upper layer 14c1 (refer to FIG. 6D). The configuring or selective etching for patterning is performed such that the each of the first strip film 14a1 partly overlies a corresponding one of the n⁺-type buried diffused layer, which is previously formed as a bit line. The arrangement of the first strip films 14a1 is similar to that of the strip polycrystalline films 4 in FIG. 3. During the etching operation, the upper layer 14c of the first polycrystalline silicon film 14a having a higher concentration exhibits an increased etch rate while the lower layer 14b having a lower concentration exhibits a reduced etch rate.

Subsequently, an intergate oxide film 5a is formed on the surface of each of the first strip films 14a by a thermal oxidation of the surface of the first strip films 14a1 at a temperature of 900° C. or higher, by using a CVD process or by a combination thereof. Alternatively, the intergate oxide film 5a may be replaced by another intergate insulating film of so-called ONO structure including three layers of oxide film—nitride film—oxide film. Thereafter, a second polycrystalline silicon film 6a is grown to a film thickness on the order of 3,000 angstroms in order to form a control gate, thereby obtaining the structure of FIG. 6D.

Figure 6E:
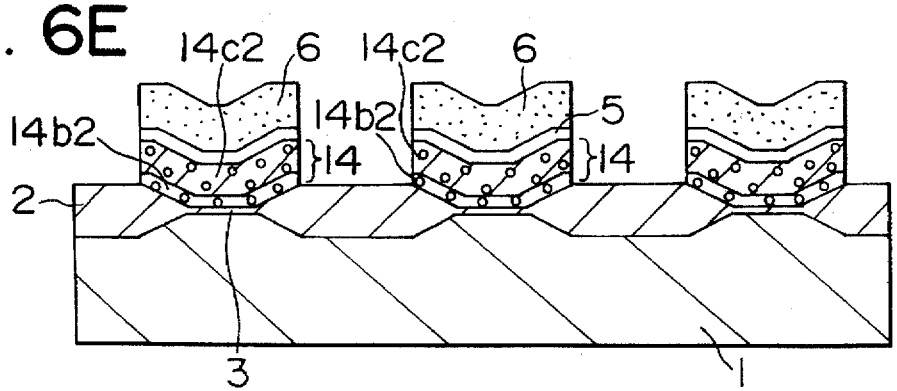

A plurality of strip control gates 6 are then formed by configuring the second polycrystalline silicon film 6a in a pattern in which it is separated by planes extending perpendicular to the plane of the drawing by using a photolithographic dry etching process. Then follows an etching of the intergate oxide film 5a and the first strip films 14a1, thus forming a plurality of separate floating is gates 14 arrayed in a matrix and each including a lower layer 14b2 and an upper layer 14c2, as well as intergate insulating films 5 interposed between the control gates 6 and the floating gates 14, as shown in FIG. 6E. After the etching step, the strip control gates 6 extend parallel to one another in the row direction for implementing word lines while the separate floating gates 14 are arranged in a matrix along the column and row directions.

In the present embodiment, a common photoresist pattern is used to configure the second polycrystalline film 6a and the first strip films 14a1 to form the control gates 6 and the floating gates 14. However, as an alternative, a separate photolithographic process may be applied after the formation of the strip control gates 6 to define a photoresist, which is then used to form the floating gates 14.

Figure 6F:
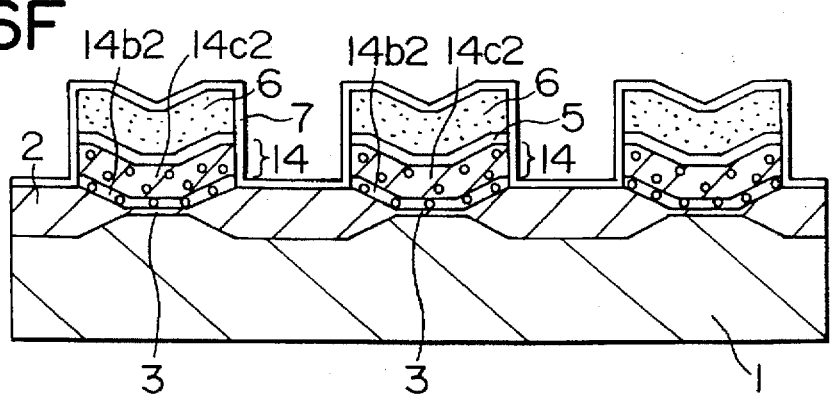

Subsequently, a silicon oxide film 7 is formed by a thermal oxidation or CVD process so as to cover at least the upper surface and the side surfaces of the control gates 6 and the side surfaces of the floating gates 4, thereby obtaining the structure of FIG. 6F.

Finally, an interlayer insulating film which covers the entire surface is formed, then selectively removed to define contact holes required to make an electrical contact with the silicon substrate or the polycrystalline films, followed by deposition of a conductor film made of a metal such as Al, which is then patterned to define a interconnection layer.

Second Embodiment

Referring to FIGS. 7A to 7E, there is shown a flash memory according to a second embodiment of the present invention during consecutive steps of a process for manufacturing the same. The flash memory has a structure and a circuit configuration similar to those shown in FIGS. 1, 3 and 4 except that the floating gate of the present embodiment has a two-layer structure. FIGS. 7A to 7E correspond to the section taken along line A—A in FIG. 1.

As is the case in the first embodiment, a plurality of n⁺-type buried diffused layers are formed in the surface region of a p-type silicon substrate 1, similarly to the first embodiment, so as to extend parallel to one another in a column direction by using a photolithography and an ion implantation technology. A silicon oxide film is then deposited on the p-type silicon substrate 1 to a film thickness about 4,000 angstroms by using a CVD process. The silicon oxide film is then removed in regions each having a width of 4,000 angstroms, thus forming field oxide films 2 each having a rectangular cross-section to define a plurality of active regions extending in the column direction. A silicon oxide film constituting a gate oxide film 3 is grown between field oxide films 2 to a film thickness on the order of 200 angstroms by thermal oxidation, thereby obtaining the structure of FIG. 7A.

Figure 7A:
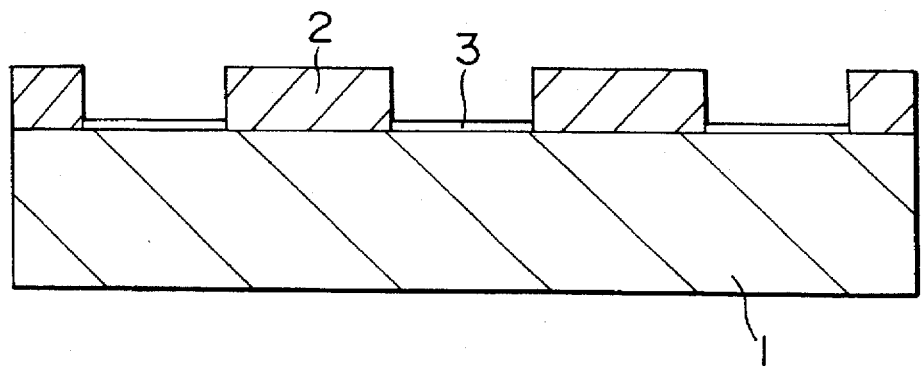
FIGS. 7A to 7E are fragmentary cross sections of a flash memory according to a second embodiment, for showing consecutive steps of a manufacturing process.
Figure 7B:
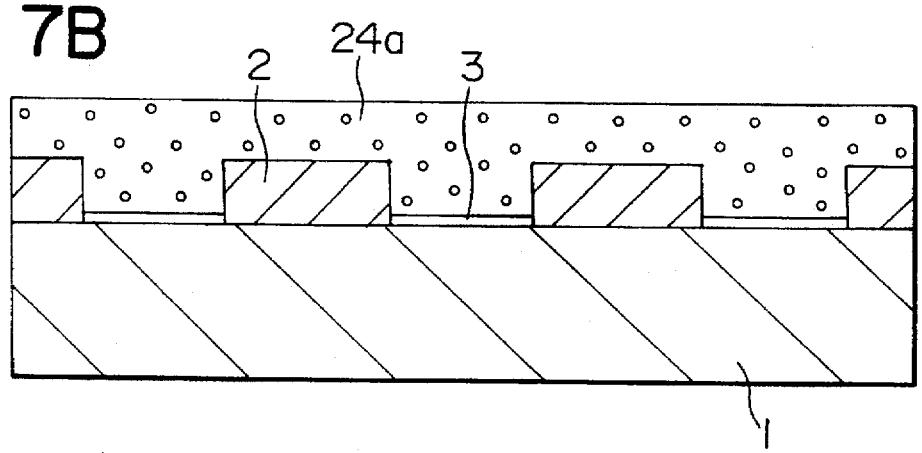

A first polycrystalline silicon film 24a, which is undoped, is grown to a film thickness on the order of 3,000 angstroms by a CVD process, as shown in FIG. 7B. The large thickness of the polycrystalline film 14a on the order of 3,000 angstrom allows the spaces between the adjacent rectangular field oxide films 2 to be completely embedded by a lower layer 24b of the polycrystalline film 24a, leaving an upper layer 24c of the first polycrystalline silicon film 24a exceeding the upper surface of the field oxide films 2 and having a flat surface.

Figure 7C:
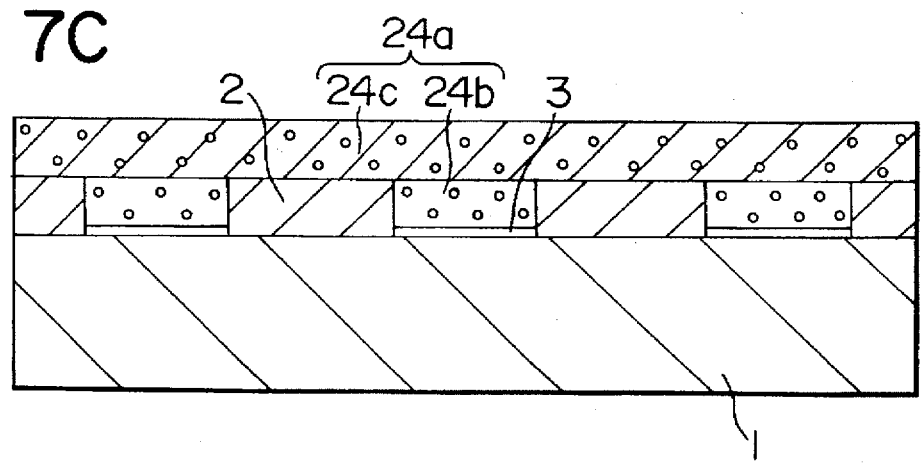

Phosphorus is then introduced into the first polycrystalline silicon film 24a by an ion implantation process. The ion implantation takes place at an energy level which prevents the phosphorus from being introduced to a depth greater than 3,000 angstroms in the first polycrystalline film 24a. As a consequence, the lower layer 24b of the first polycrystalline silicon film 24a embedded in the spaces between adjacent two of the field oxide films 2 is not substantially doped with the impurity ions to form undoped lower layer of the first polycrystalline silicon film 24a. On the other hand, the upper layer 24c of the first polycrystalline silicon film 24a is doped with impurity ions to have a higher impurity concentration, as shown in FIG. 7C. Again, it is desirable, that the ions be implanted at a deeper level which is consistent with avoidance of adverse influences upon the erasure response, in order to achieve a high throughput.

Figure 5:
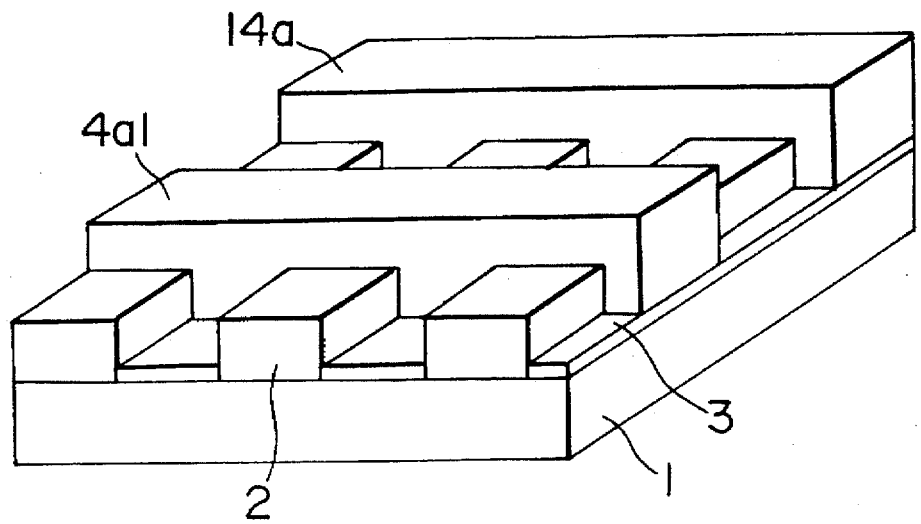
FIG. 5 is a perspective view of the conventional flash memory of FIGS. 1 through 3 during a step of manufacturing the same.
Figure 8:
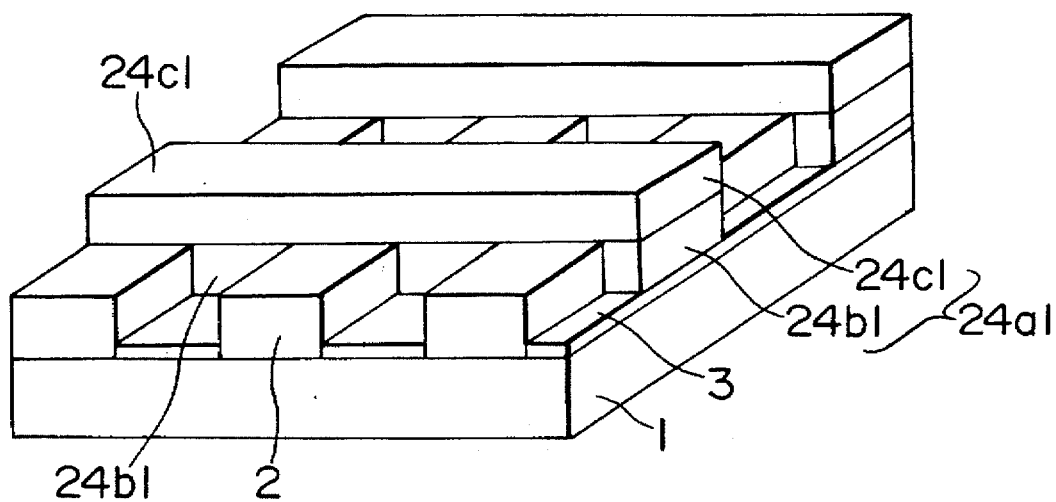
FIG. 8 is a perspective view of the flash memory of the second embodiment during a step of manufacturing the same.

After the ion implantation into the first polycrystalline film 24a to increase its conductivity, the first polycrystalline silicon film 24a is configured into a pattern in which the first polycrystalline film 24a is divided by planes parallel to the plane of the drawing, thereby obtaining the structure shown in the perspective view of FIG. 8. The structure of FIG. 8 is similar to that of FIG. 5 except that each of the first strip films 24a1 made of polycrystalline silicon has a two-layer structure including a lower layer 24b1 and an upper layer 24c1 in FIG. 8. The lower layer 24b1 of the strip film 24a1 has a thickness substantially equal to the thickness of the field oxide films 2. The first strip films 24a1 extend parallel to one another in the column direction.

The etching process for patterning of the first polycrystalline silicon film 24a is performed such that each of the first strip films 24a1 partly overlies the n⁺-type buried diffused layer, which is previously formed as a bit line. During the etching process, the upper layer 24c of the first polycrystalline silicon film 24a having a higher concentration exhibits a higher etch rate while the lower layer 24b having a lower concentration exhibits a lower etch rate.

Figure 7D:
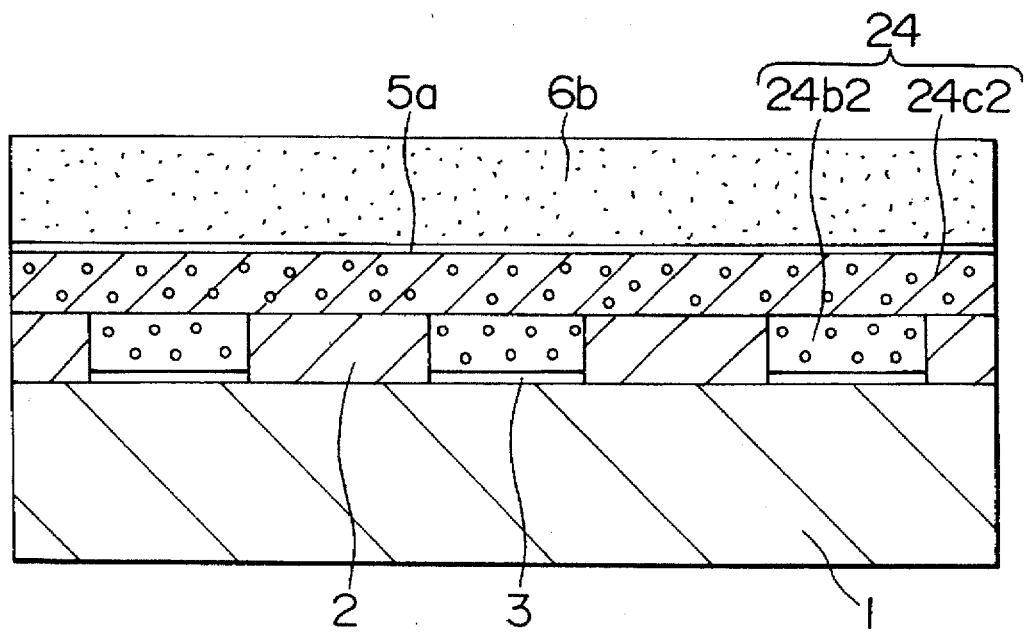
Figure 7E:
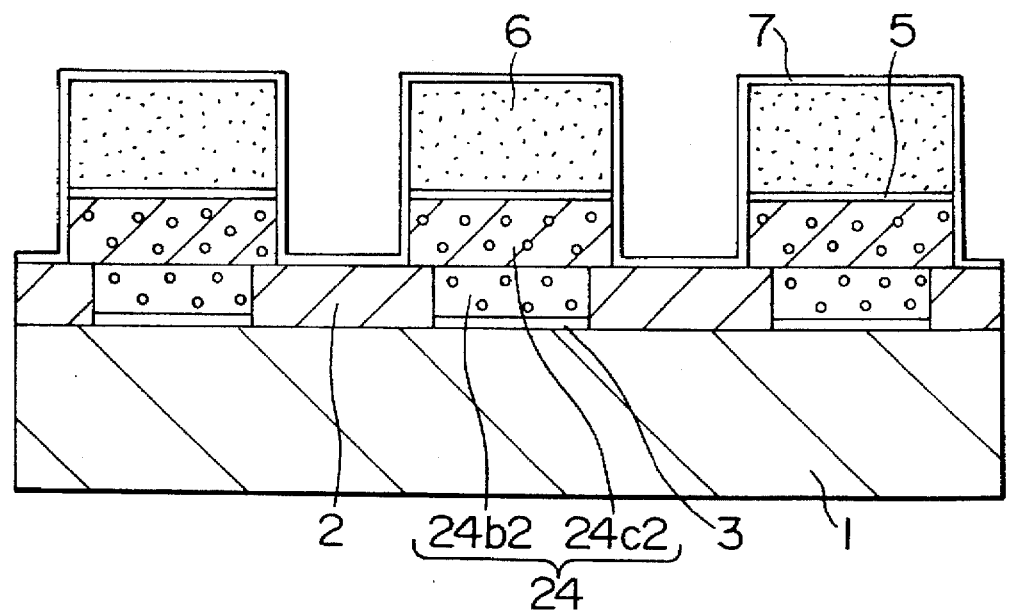

Subsequently, an intergate oxide film 5a is formed on the surface of the first strip films 24a1 by employing thermal oxidation of the surface of the first strip films 24a1 at a temperature equal to or greater than 900° C., by employing a CVD process or by a combination thereof. A second polycrystalline silicon film 6a is then grown to a film thickness on the order of 3,000 angstroms in order to define control gates as shown in FIG. 7D.

The second polycrystalline silicon film 6a is configured, using a photolithographic dry etching process, into a pattern in which a plurality of second strip films constituting control gates 6 extend parallel to one another in the row direction, then follows an etching of the intergate oxide film 5a and the first strip films 24a1, so as to form the intergate insulating film 5 and the floating gates 4. A silicon oxide film 7 is then formed, by using either a thermal oxidation or CVD process, to cover at least the upper surface and the side surfaces of the control gates 6 and the side surfaces of the floating gates 24, thereby obtaining the structure of FIG. 7E.

Finally, an interlayer insulating film not shown in the drawings is formed over the entire surface, and is formed with contact holes therein in order to make an electrical contact to the silicon substrate and the polycrystalline silicon films, followed by the deposition of a metallic film and a patterning thereof, thus forming an interconnection layer.

Modifications

While a few preferred embodiments have been disclosed above, it should be understood that the present invention is not limited to merely such embodiments, but that a number of changes, modifications and substitutions therein are possible within the extent of the present invention defined by the appended claims.

By way of example, While a polycrystalline silicon film is formed, which includes both layers having a lower and a higher concentrations, through ion implantation into a first polycrystalline film which is undoped during the growth step in the embodiment, such procedure may be replaced by growing a polycrystalline silicon which is not doped with an impurity during an initial phase of the film formation, followed by a growth of a doped, polycrystalline silicon film by feeding a doping gas during the subsequent phase of the growth. It should also be understood that the present invention is applicable to a non-volatile semiconductor memory device other than such device of virtual ground, split gate type.

What is claimed is:

1. A non-volatile semiconductor memory device comprising:

a semiconductor substrate, a plurality of diffused layers formed in said semiconductor substrate and extending parallel to one another in a column direction, each adjacent two of said diffused layers defining a channel region, a plurality of field insulating film extending parallel to one another in a row direction, for dividing each of said channel region into a plurality of channels, a plurality of floating gates arrayed in a matrix in said row and column directions, each of said floating gates being disposed in operative relationship with a corresponding one of said channels, each of said floating gates being composed of a lower layer having a first impurity concentration and an upper layer having a second impurity concentration which is higher than said first impurity concentration, each of the layers having an even thickness, and a plurality of control gates extending parallel to one another in said row directions and each overlaying a corresponding row of said floating gate.

2. A non-volatile semiconductor memory device according to claim 1 wherein each of said control gates opposes a first portion of a corresponding one of said channels with an intervention of a corresponding one of said floating gates, and directly opposes a second portion of said corresponding one of said channels.

3. A non-volatile semiconductor memory device according to claim 1 wherein a thickness of said lower layer is not larger than a thickness of said upper layer.

4. A non-volatile semiconductor memory device according to claim 1 wherein a thickness of said lower layer is substantially same as a thickness of said field insulating film.

* * * * *